United States Patent [19]
Matsuoka et al.

[11] Patent Number: 5,220,182
[45] Date of Patent: Jun. 15, 1993

[54] SEMICONDUCTOR DEVICE HAVING CONDUCTIVE SIDEWALL STRUCTURE BETWEEN ADJACENT ELEMENTS

[75] Inventors: Fumitomo Matsuoka, Kawasaki; Masaaki Kinugawa, Tokyo, both of Japan

[73] Assignee: Kabushiki Kaisha Toshiba, Kawasaki, Japan

[21] Appl. No.: 824,406

[22] Filed: Jan. 23, 1992

[30] Foreign Application Priority Data

Jan. 28, 1991 [JP] Japan ................................ 3-25058

[51] Int. Cl.$^5$ ...................... H01L 27/01; H01L 29/04
[52] U.S. Cl. ...................................... 257/67; 257/393; 257/659; 257/903
[58] Field of Search ............ 357/59 E, 23.7, 42, 357/53; 257/903, 393, 659, 67

[56] References Cited

U.S. PATENT DOCUMENTS 4,771,323  9/1988  Sasaki ............................ 357/59 E
5,060,035 10/1991  Nishimura et al. ............... 357/42

Primary Examiner—Rolf Hille
Assistant Examiner—Robert Limanek
Attorney, Agent, or Firm—Finnegan, Henderson, Farabow, Garrett & Dunner

[57] ABSTRACT

A semiconductor device comprising an electrode or wiring layer formed over a semiconductor substrate, a circuit element provided adjacent the electrode or wiring layer, and a conductive layer formed on a side wall, or a side wall and top surface, of the electrode or wiring layer with an insulating film provided therebetween, and supplied with a fixed potential or a variable potential different from a potential on the electrode or wiring layer.

1 Claim, 5 Drawing Sheets

SEMICONDUCTOR DEVICE HAVING CONDUCTIVE SIDEWALL STRUCTURE BETWEEN ADJACENT ELEMENTS

BACKGROUND OF THE INVENTION

1. Field of the Invention

The present invention relates to a semiconductor device and, in particular, to a semiconductor device using a thin film transistor (hereinafter referred to as a TFT).

2. Description of the Related Art

With a recent microminiaturization and high density arrangement of an SRAM, the current tendency has been from a high resistance load type heretofore employed toward a TFT load type SRAM. TFT as used for, for example, the TFT load type SRAM, etc., with a diffusion layer formed in a semiconductor substrate and used as the TFT gate will be explained below with reference to FIGS. 1(A) to 1(C).

As shown in FIG. 1(A), an element isolation area 102 is provided, by, for example, a selective oxidation method, at a predetermined area on the surface of, for example, a P type Si substrate 101. A gate oxide film 103, for example, is formed, by a thermal oxidation method, etc., on the resultant structure to have a thickness of about 10 nm. A polycrystalline silicon about 300 nm thick is deposited on the gate oxide film 103 and a predetermined pattern is formed by using a photoetching method to produce an ordinary MOSFET's gate electrode 104.

With the gate electrode 104 used as a mask, an As ion is implanted, for example, at a dose of about $5 \times 10^{15}/cm^2$ and acceleration voltage of 35 KeV into the semiconductor structure to provide diffusion layers 105 for ordinary MOSFET's source and drain regions.

As shown in FIG. 1(B), a TFT gate oxide film 106 is then formed, by the chemical vapor deposition method, on the semiconductor structure at a thickness of about 20 nm. A polycrystalline silicon (hereinafter referred to as a TFT poly) for TFT channel and source and drain regions is deposited, by a CVD method, etc., on the resultant structure at a thickness of about 50 nm and a predetermined poly-Si pattern 108 is formed by the photoetching method as shown in FIG. 1(C).

Then, for example, an impurity ion is selectively implanted by a photoetching method in the source and drain formation areas of the polycrystalline silicon layer 108 to provide impurity regions, not shown. Thereafter, a predetermined metallization step etc., are performed to complete a semiconductor device.

Forming respective specific TFT gate and channel regions as a different structure from that shown in FIG. 1 will be explained below with reference to FIGS. 2(A) to 2(D).

First, an element isolation area 202 is formed by a selective oxidation method, etc., at a predetermined area on, for example, a P type silicon substrate 201 as shown in FIG. 2(A). A thermal oxidation film 203, for example, is formed on the semiconductor structure at a thickness of about 10 nm. A polycrystalline silicon is deposited on the resultant structure at a thickness of about 300 nm and a predetermined pattern is formed by the photoetching method to provide an ordinary MOSFET's gate electrode 204. With the gate electrode 204 used as a mask, an As ion is implanted in the semiconductor structure at a dose of about $5 \times 10^{15}/cm^2$ and acceleration voltage of 35 KeV to provide diffusion layers 205 for normal MOSFET's source and drain regions.

As shown in FIG. 2(B), $SiO_2$ is deposited by the CVD method, etc., on the semiconductor structure at a thickness of about 300 nm to provide an insulating interlayer 206. Then polycrystalline silicon is deposited by the same CVD method on the semiconductor structure at a thickness of, for example, about 100 nm. A predetermined pattern is formed by the photoetching method on the semiconductor structure to provide a TFT gate electrode 207.

As shown in FIG. 2(C), $SiO_2$ is deposited by, for example, the chemical vapor deposition method on the semiconductor structure as shown in FIG. 2(C) to provide a gate oxide film 208.

A polycrystalline silicon (TFT poly) 209 for TFT channel and source and drain regions is deposited by, for example, the CVD method on the semiconductor structure at a thickness of about 50 nm.

As shown in FIG. 2(D), a predetermined poly-Si pattern 210 is formed by the photoetching method on the semiconductor structure. An impurity ion is, for example, selectively implanted by the photoetching method in the source and drain regions of the poly-Si pattern 210 to provide impurity regions, not shown. Thereafter, a predetermined metallization step etc., are performed to complete a semiconductor device.

In the TFT structure manufactured by the method as set out in conjunction with FIG. 1, if the distance between the TFT poly 108 and the gate electrode 104 of MOSFET over the silicon substrate 101 is decreased below 1 $\mu$m at an area 109 shown in FIG. 1(C), TFT poly 108 to be essentially controlled by the diffusion layer 105 serving a both the TFT gate electrode and MOSFET drain is adversely affected by the MOSFET gate electrode 104 over the silicon substrate 101, failing to perform an essentially expected circuit operation.

For the distance of over 1 $\mu$m, on the other hand, a major problem arises with those devices required of their microminiaturization. It is, therefore, not possible to lay out a very small SRAM cell using, for example, TFT.

In the TFT structure manufactured by the method of FIG. 2, as shown in FIG. 2(D), the area 109 is completely shielded by the TFT gate electrode 207 and, therefore, there occurs no problem as set out above.

However, the TFT structure requires its own special gate electrode 207, making the manufacturing steps more complicated. This makes a step layer formation tolerance stricter and, moreover, an overlying interconnection layer formation tolerance and its reliability stricter.

SUMMARY OF THE INVENTION

It is accordingly the object of the present invention to provide a semiconductor device of high reliability which can operate a TFT, under better control, in as simple a process as possible.

According to the present invention, there is provided a semiconductor device at least comprising an electrode or wiring layer formed over a semiconductor substrate and a conductive layer formed on a side wall, or a side wall and top surface, of the electrode or wiring layer with an insulating film provided therebetween, in which a fixed potential or a variable potential different from a potential on the electrode or wiring layer is applied to the conductive layer so as to avoid any undesirable parasitic operation.

That is, the following method is used in achieving a semiconductor device for operating a TFT, under better control, in a simpler process.

First, a MOSFET gate electrode is formed over a semiconductor substrate in accordance with a conventional process and a diffusion layer is formed with the gate electrode used as a mask. An oxide film is formed over the whole surface of the resultant structure by means of a thermal oxidation method. A conductive layer is provided over the oxide film and anisotropically etched to leave a side wall relative to a MOSFET gate electrode. An oxide film is formed over the conductive layer and a contact hole is opened to allow the conductive layer to be connected to the diffusion layer.

After a metal has been deposited into the contact hole, an oxide film for opening a contact hole is removed and a TFT gate oxide film is formed by the thermal oxide method, etc. A film for TFT channel and source and drain formation is deposited over the TFT gate oxide film in a manner to have a predetermined configuration. The subsequent steps are the same as in the conventional steps. Impurity regions are, for example, ion implanted at those area where TFT source and drain regions are formed. A semiconductor device is completed subsequent to a predetermined metallization step, etc.

In this structure, the conductive layer left as the side wall relative to the MOSFET gate electrode is set at the same potential as that on the diffusion layer serving as the TFT gate electrode and, by so doing, a shield can be achieved between the TFT poly and the MOSFET gate electrode.

Although the conductive layer as the aforementioned side wall can be set at the same potential as that on the TFT gate electrode, for example, through the contact hole, it may be achieved by the following method.

In accordance with the steps as set out above, a MOSFET gate electrode is formed, followed by the formation of a diffusion layer and formation of an oxide film by a thermal oxide method over a resultant semiconductor structure. Then the semiconductor structure is anisotropically etched to leave an oxide film only over the side wall of the MOSFET gate electrode, a conductive layer is formed over the oxide film, and the semiconductor structure is anisotropically etched, leaving a conductive layer only over the side wall of the oxide film, that is, relative to the side wall of the MOSFET gate electrode.

The subsequent steps are the same as set forth above. By so doing, the conductive layer is connected to the diffusion layer serving as a TFT gate electrode and hence a shield can be achieved between TFT poly and the MOSFET gate electrode.

TFT is comprised of PMOSFET and connected in series with NMOSFET over the semiconductor substrate to provide an inverter. In an SRAM cell having a flip-flop composed of two such converters, it should be avoided, in view of the need to maintain a standby current low, that PMOSFET having the NMOSFET drain as a gate electrode is rendered ON, due to a potential action of the NMOSFET gate electrode, in spite of the need to be rendered OFF.

This can be achieved by forming the aforementioned conductive layer as a side wall relative to the MOSFET gate electrode and connecting the side wall of the conductive layer to the diffusion layer serving as a TFT gate electrode. A simpler method can also be employed as set out below.

That is, after an NMOSFET has been provided, NMOSFET source and drain and gate are covered with a thermal oxide film and a conductive layer is formed over the thermal oxide film. The conductive layer is anisotropically etched to leave a portion over the side wall of the oxide film, that is, a portion relative to the side wall of the NMOSFET gate electrode and contact is taken, at some cell distance, with a wiring layer fixed to an operation voltage of the corresponding cell.

By so doing, the NMOSFET gate electrode is set at a ground potential and PMOSFET fails to be erroneously rendered ON, due to a potential action of the NMOSFET gate electrode, when PMOSFET is to be turned OFF after a potential on the NMOSFET drain serving as the TFT gate electrode is set at the operation voltage of the cell.

This object can be achieved by forming a thin insulating film over the side wall (conductive layer), provided that an adequate TFT poly portion is provided on an original TFT gate electrode even if the TFT poly portion rides over the side portion (conductive portion) due to a photomask misalignment at a lithographic step. The reason is that the TFT poly portion riding on the side wall (conductive layer) is kept OF at all times and imparts no influence to a standby current. The TFT poly portion over the original TFT gate electrode has the ON/OFF characteristic naturally expected for TFT and the cell stability is increased, while lowering the standby current.

According to the present invention, therefore, the circuit element adjacent the electrode or wiring layer can avoid any undesired parasitic operation by the potential on the electrode or wiring layer and TFT can be operated, under better control, in as simple a process as possible.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENT

The semiconductor device of the present invention will be explained below with reference to the accompanying drawings. A first embodiment of the present invention will be explained below in connection with its manufacturing method.

Figure 3:
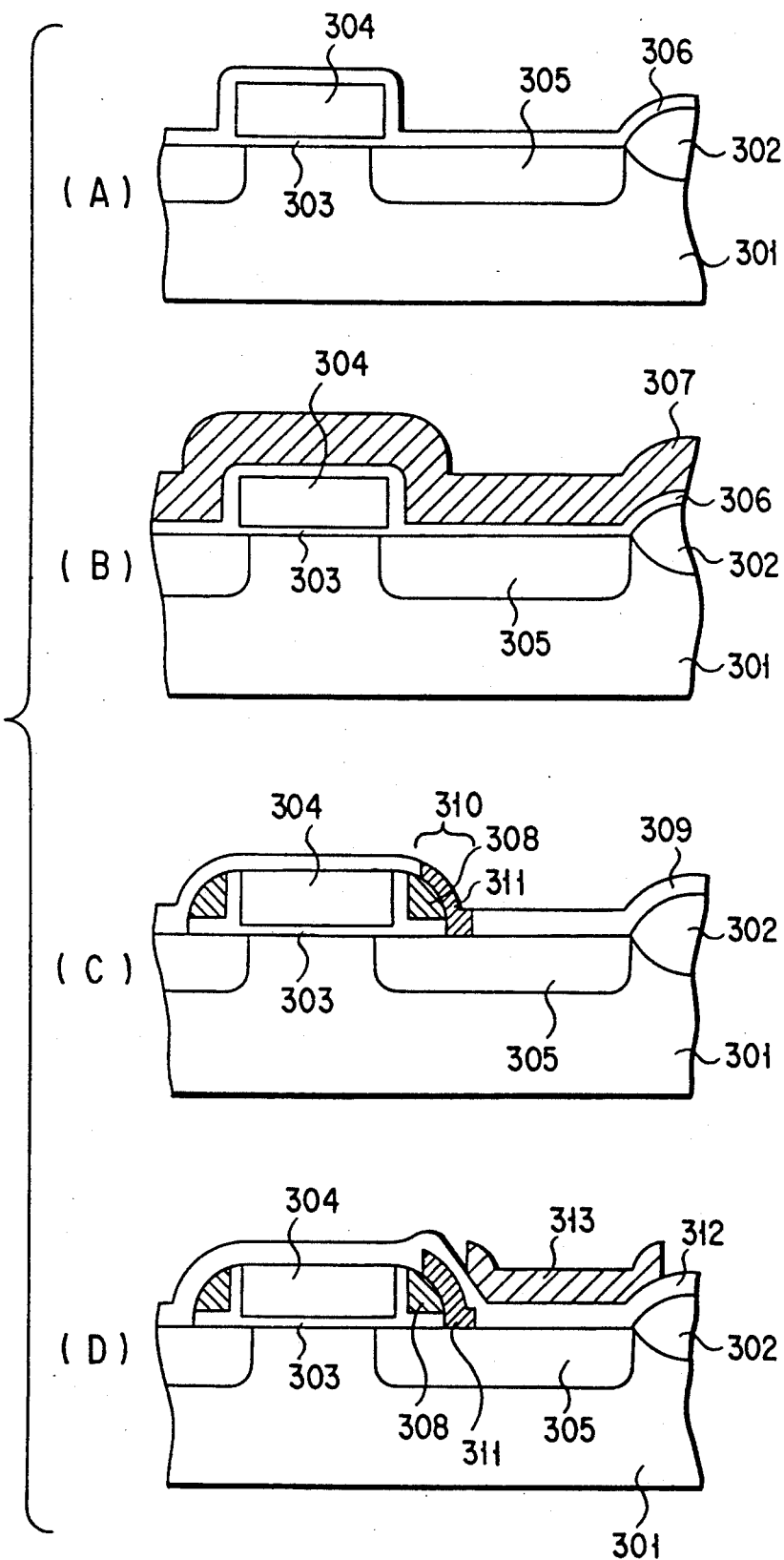
FIGS. 3(A) to 3(D) each, are a cross-sectional view showing the manufacture of a semiconductor device according to a first embodiment of the present invention.

As shown in FIG. 3(A), an element isolation area 302 is formed by a selective oxidation method on a semiconductor substrate 301 of, for example, P type. An $SiO_2$ film about 10 nm thick is deposited by a thermal oxidation method over the semiconductor substrate 301 to provide a MOSFET gate oxide film 303. A polycrystalline silicon layer about 200 nm thick is deposited, by a CVD method for instance, on the gate oxide film 303 and an impurity ion (As) is implanted into the semiconductor structure at a dose of about $5 \times 10^{15}/cm^2$ and acceleration voltage of 35 KeV so as to reduce a resistance involved. The polycrystalline silicon is anisotropically etched into a predetermined pattern, while at the same time using a photoetching method, to provide a MOSFET gate electrode 304.

With the gate electrode 304 used as a mask, an As ion is implanted into the semiconductor structure, for example, at a dose of about $5 \times 10^{15}/cm^2$ and acceleration voltage of 35 KeV to provide MOSFET source and drain regions and gate electrode in a diffusion layer 305. An $SiO_2$ layer (306) about 30 nm thick is formed by the thermal oxidation method over the semiconductor structure.

As shown in FIG. 3(B), a polycrystalline silicon layer (307) about 300 nm thick is deposited, by the CVD method for instance, over the $SiO_2$ layer 306. An As ion is implanted into the semiconductor structure, for example, at a dose of about $5 \times 10^{15}/cm^2$ and acceleration voltage of 35 KeV so as to reduce a resistance involved. By the anisotropic etching of the polycrystalline silicon layer 307, a polycrystalline silicon layer (insulating layer) 308 is left only on the side wall of the gate electrode 304 as shown in FIG. 3(C).

A polycrystalline silicon layer about 30 nm thick is deposited, by the CVD method or the thermal oxidation method, on the semiconductor structure to form an oxide film 309 and a contact hole 310 of a predetermined pattern is provided, by both the anisotropic etching and photoetching steps, to connect the polycrystalline silicon layer 308 to the diffusion layer 305 serving as the TFT gate electrode. Tungsten is selectively deposited by the CVD method into the contact hole 310 to provide a conductive layer 311. In this connection it is to be noted that the CVD method employs, for example, WF6.

The oxide film 309 is removed with the use of HF and $NH_4F$ and, as shown in FIG. 3(D), a $SiO_2$ layer about 30 nm thick is deposited by the thermal oxidation method to provide a TFT gate oxide film 312. A polycrystalline silicon layer 313 for forming TFT channel and source and drain regions is deposited, by the CVD method for instance, on the semiconductor structure and formed by the photoetching and anisotropic etching methods into a predetermined pattern.

In order to provide TFT source and drain regions, an impurity is, for example, selectively ion implanted into the polycrystalline silicon layer 313 with the use of the photoetching method. A semiconductor device is completed subsequent to a metallization step, etc.

At the time of operating the semiconductor device, the conductive layer 311 is fixed to a potential acting in a direction to shield the gate electrode against the TFT as set out in "Summary of the Invention".

A second embodiment as shown in FIGS. 4(A) to FIG. 4(D) will be explained below in connection with its manufacturing process.

Figure 4:
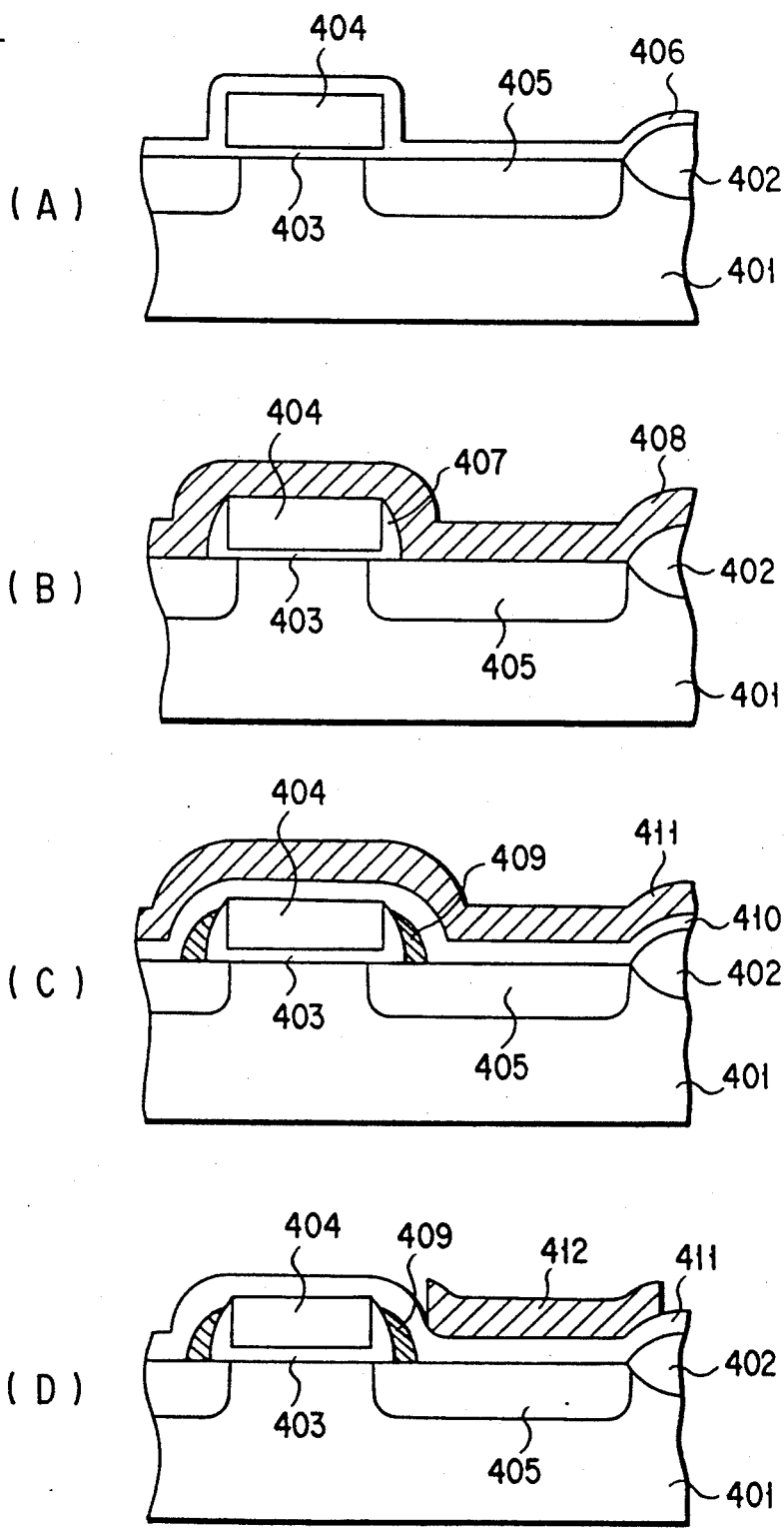
FIGS. 4(A) to 4(D), each, are a cross-sectional view showing the manufacture of a semiconductor device according to a second embodiment of the present invention.

As shown in FIG. 4(A), an element isolation area 402 is formed, by the selective oxidation method, on a semiconductor substrate 401 of, for example, P type. An $SiO_2$ film about 10 nm thick is deposited, by the thermal oxidation method, over the semiconductor substrate 401 to provide a MOSFET gate oxide film 403. A polycrystalline silicon about 300 nm thick is deposited, by the CVD method for instance, on the gate oxide film 403. An As ion is implanted on the semiconductor structure at a dose of about $5 \times 10^{15}/cm^2$ and acceleration voltage of 35 KeV so as to reduce a resistance against the polycrystalline silicon layer and a polycrystalline silicon is formed into a predetermined configuration with the use of the photoetching and anisotropic etching processes. By so doing it is possible to provide a MOSFET gate electrode 404.

With the gate electrode 404 used as a mask, an As ion is implanted in the semiconductor structure to provide a diffusion layer 405 for forming MOSFET source and drain regions and gate electrode. An $SiO_2$ layer (406) about 30 nm thick is formed, by the thermal oxidation method, on the semiconductor structure.

Then the $SiO_2$ layer 406 is anisotropically etched and, as shown in FIG. 4(B), the polycrystalline silicon layer is left only on the side wall of the MOSFET gate electrode 404 to provide an oxide film 407.

A polycrystalline silicon layer (408) about 100 nm thick is deposited, by the CVD method for instance, on the semiconductor structure. An As ion is implanted in the semiconductor structure, for example, at a dose of about $5 \times 10^{15}/cm^2$ and acceleration voltage of 35 KeV so as to reduce a resistance against the polycrystalline silicon 408. By the anisotroptic etching of the polycrystalline silicon layer 408, a polycrystalline silicon layer 409 is left only on the side wall of the oxide film 407 which is situated on the side wall of the MOSFET gate electrode 404.

Then an $SiO_2$ layer about 30 nm thick is deposited, by the thermal oxidation method, on the semiconductor structure to provide a TFT gate oxide film 410. A polycrystalline silicon layer 411 for forming TFT channel and source and drain regions is deposited, by the CVD method, on the semiconductor structure at a thickness of about 30 nm and, as shown in FIG. 4(D), a polycrystalline silicon layer 412 of a predetermined configuration is formed with the use of the photoetching and anisotroptic etching methods.

In order to form TFT source and drain regions, an impurity is, for example, ion implanted, by the photoetching process, into the polycrystalline silicon layer 412 in a selective way. A semiconductor device is completed subsequent to a metallization process, etc.

A third embodiment as shown in FIGS. 5(A) to 5(C) will be manufactured by the process below.

The object of the present invention is also achieved by the third embodiment in which a conductive layer on the side wall of a MOSFET gate electrode is fixed to a given voltage with which a TFT is turned OFF.

The process up to the formation of an SiO₂ film (thermal oxidation film) 506 is the same as set out above and a structure as shown in FIG. 5(A) is formed by so doing. In the structure shown in FIG. 5(A), reference numeral 501 denotes a P type semiconductor substrate; 502, an element isolation area; 503, a gate oxide film 504, a gate electrode; and 505, a diffusion layer.

Then a polycrystalline silicon layer about 100 nm thick is deposited, by the CVD method for instance, on the semiconductor structure and, in order to reduce a resistance against the polycrystalline silicon layer, an As ion is implanted into the semiconductor structure, for example, at a dose of about $5 \times 10^{15}/cm^2$ and acceleration voltage of 35 KeV.

Then the polycrystalline silicon layer is anisotropically etched to provide a conductive layer 507 on the side wall of the MOSFET as shown in FIG. 5(B). An SiO₂ layer (508) about 30 nm thick is deposited, by the thermal oxidation method, on the semiconductor structure at a temperature of 900° C. as shown in FIG. 5(C). A polycrystalline silicon layer 509 for forming TFT channel and source and drain regions is deposited, by the CVD method for instance, on the semiconductor structure at a thickness of about 30 nm and anisotropically etched into a predetermined configuration, while being photoetched.

In order to form TFT source and drain regions, an impurity is, for example, ion implanted into the polycrystalline silicon layer 509 in a selective way, while using the photoetching method. A semiconductor device is completed subsequent to a predetermined metallization step, etc.

In the metallization step in particular, the conductive layer 507 is so wired as to have its potential set to a desired level. In the case where, in this method, a greater misalignment occurs at a lithographical step when compared with a distance between the TFT poly and the MOSFET gate electrode, there is a possibility that the TFT poly will ride over the MOSFET gate electrode. It is, therefore, necessary to provide the conductive layer not only on the side wall but also on the top surface of the MOSFET gate electrode.

Figure 5:
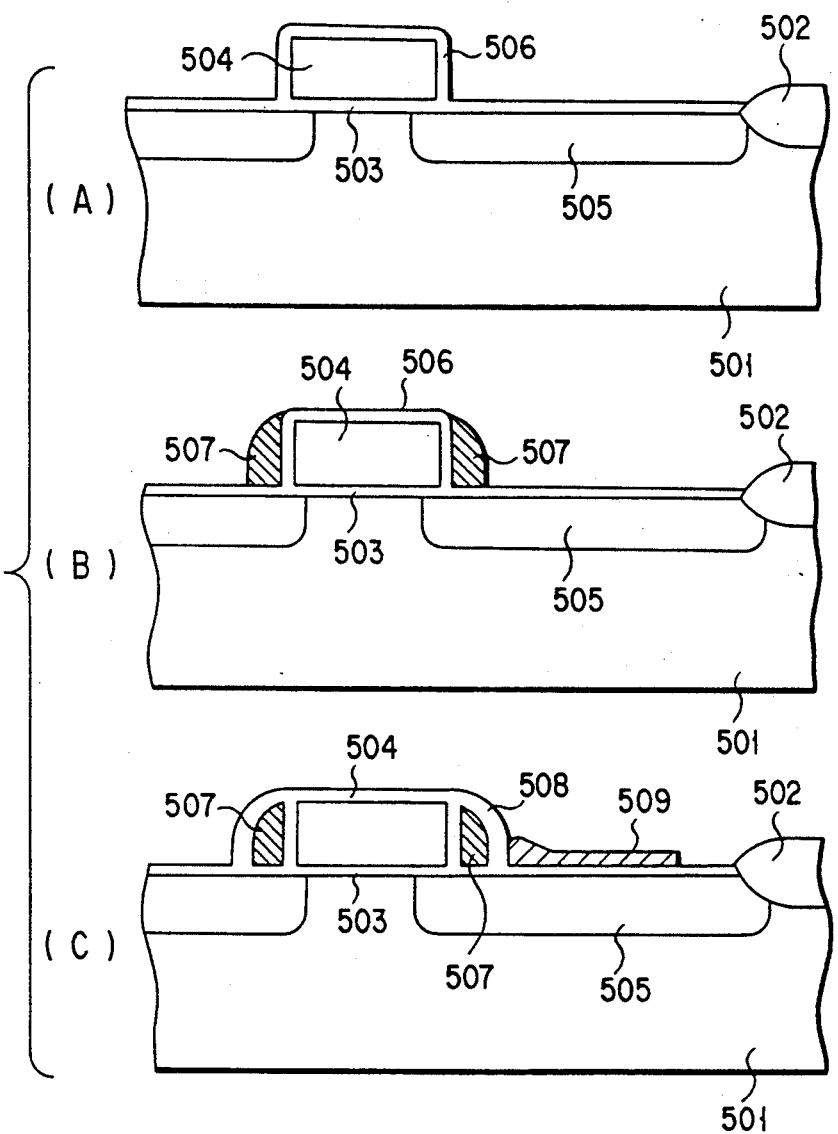
FIGS. 5(A) to 5(C) each, are a cross-sectional view showing the manufacture of a semiconductor device according to a third embodiment of the present invention.
Figure 6:
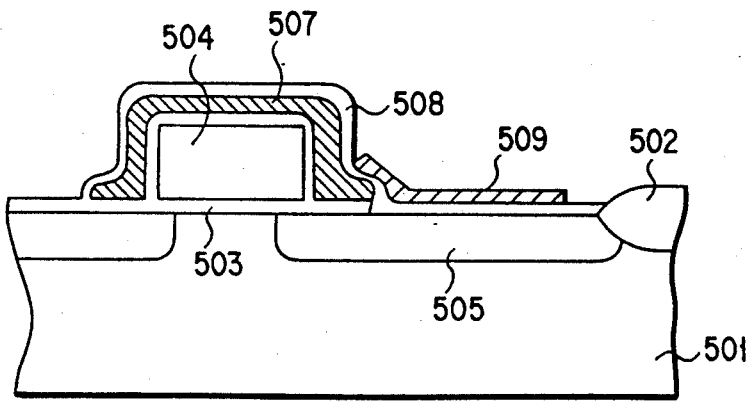
FIG. 6 is a cross-sectional view showing the manufacture of a semiconductor device according to a fourth embodiment of the present invention.

In the process from a step (A) to a step (B) in FIG. 5, that is, at the anisotropic etching of the polycrystalline silicon layer, if the resist is left in a manner to surround the MOSFET gate electrode, the conductive layer 507 is also provided over the MOSFET gate electrode 504 as shown in a fourth embodiment of FIG. 6. By so doing, it is possible to provide a complete shield, though requiring one additional lithographic step.

In these embodiments, although the polycrystalline silicon has been explained as being used as a material for forming the side wall relative to the MOSFET gate electrode, the present invention is not restricted to this material. Any other proper material may be used if it provides a conductive film.

Although, in the aforementioned embodiment, explanation has been given about the method for shielding a potential influence at the MOSFET gate electrode provided over the substrate, it is obviously possible to use such a method when a potential influence is shielded at an ordinary wiring layer.

Although, in order to secure a normal operation of a TFT, the potential influence has been explained as being shielded at the adjacent conductive layer, it is obviously possible that the present invention can also be applied to the case where, in order to prevent an ordinary wiring layer from being influenced from an adjacent other wiring layer, a shield is achieved against the potential on the latter wiring layer.

The present invention can also be applied to the case where an electrode over the semiconductor substrate is comprised of a gate electrode of a driver transistor, that is, of an NMOSFET in an SRAM cell, and an adjacent circuit element is comprised of a PMOSFET in which a potential on the conductive layer is fixed to the operation level of the SRAM cell or is made variable as in the case of a drain voltage on the driver transistor.

Figure 1:
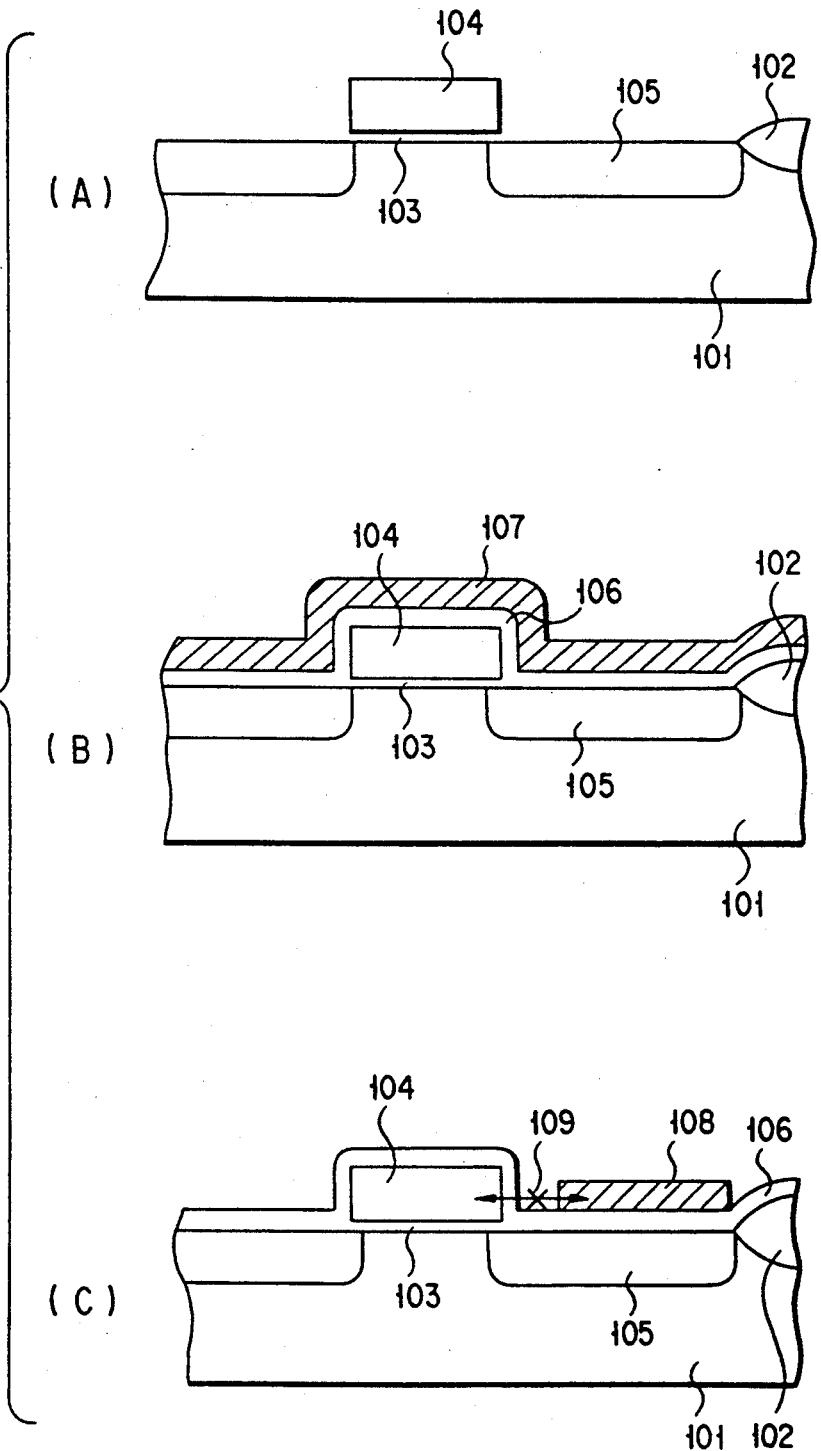
FIGS. 1(A) to 1(C) each, are a cross-sectional view showing the manufacture of a conventional semiconductor device.

According to the present invention, as set out in more detail above, the conductive layer on the side wall of the MOSFET gate electrode overlying the semiconductor substrate is maintained at the same potential as the TFT gate electrode (diffusion layer) and, even if the area 109 in the conventional semiconductor structure shown in FIG. 1 is shortened as already set out above, the TFT channel is not influenced from a potential on the MOSFET gate electrode overlying the semiconductor substrate. By so doing it is possible to provide a highly reliable TFT operation.

Figure 2:
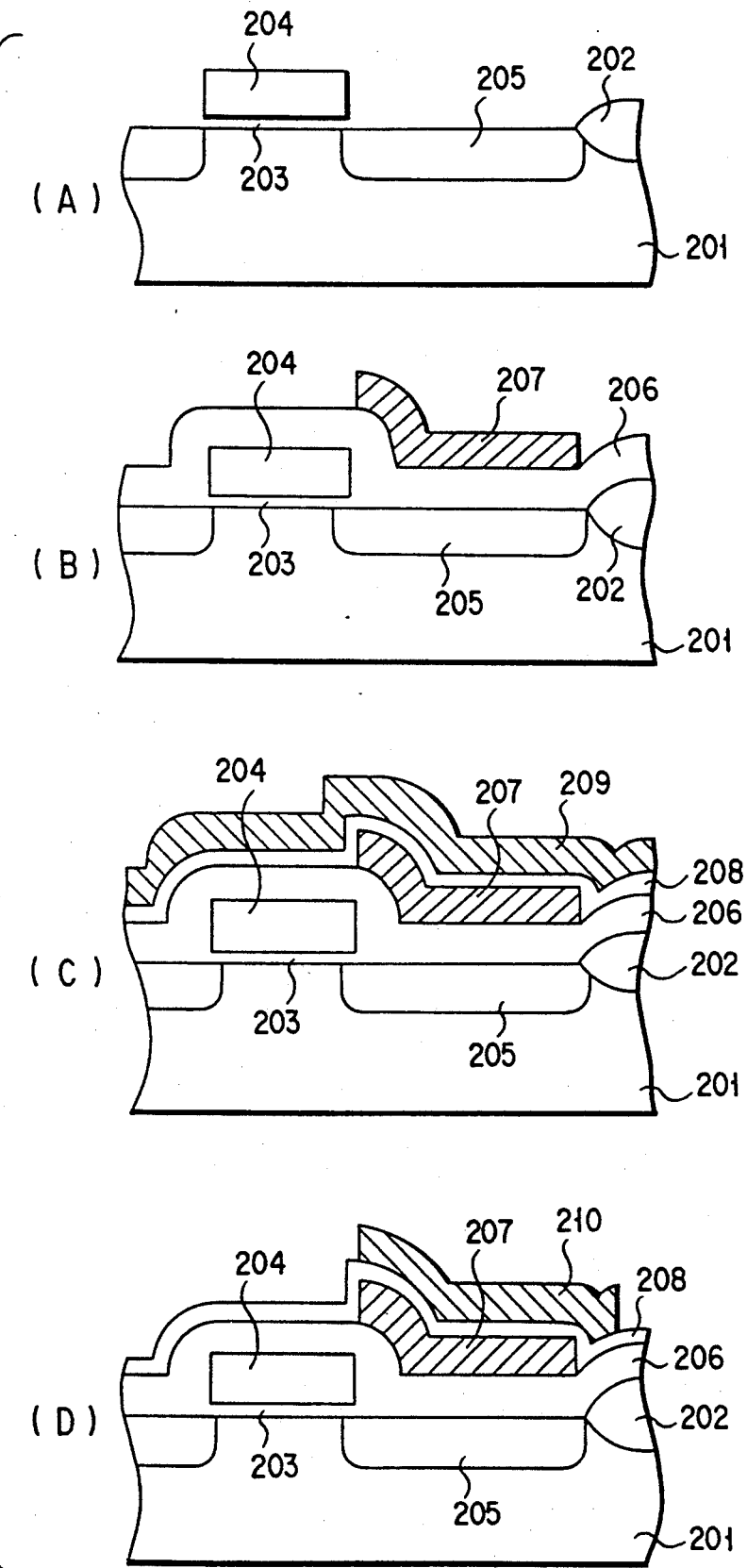
FIGS. 2(A) to 2(D), each, are a cross-sectional view showing the manufacture of another conventional semiconductor device.

According to the present invention it is possible to reduce one additional layer compared with the conventional method for forming a special film corresponding to a TFT gate electrode as shown in the conventional example (FIG. 2), and hence to reduce the steps required. It is thus possible to make the semiconductor device simpler in structure, to alleviate a step layer configuration tolerance and to facilitate the readiness with which the upper layer is formed.

Additional advantages and modifications will readily occur to those skilled in the art. Therefore, the invention in its broader aspects is not limited to the specific details, and representative devices, shown described herein. Accordingly, various modifications may be made without departing from the spirit or scope of the general inventive concept as defined by the appended claims and their equivalents.

What is claimed is:

1. A semiconductor device comprising a gate electrode or wiring layer formed over a semiconductor substrate, the gate electrode being comprised of a gate electrode of a driver transistor comprised of an NMOSFET in an SRAM; a PMOSFET provided adjacent to the gate electrode or wiring layer; and a conductive layer formed on a side wall, or a side wall and top surface, of the gate electrode or wiring layer with an insulating film provided therebetween and supplied with a fixed potential or a variable potential different from a potential on the gate electrode or wiring layer.

* * * * *